US006201274B1

(12) United States Patent
Kanamori

(10) Patent No.: US 6,201,274 B1
(45) Date of Patent: Mar. 13, 2001

(54) SEMICONDUCTOR DEVICE WITH NO STEP BETWEEN WELL REGIONS

(75) Inventor: Kohji Kanamori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/179,392

(22) Filed: Oct. 27, 1998

(30) Foreign Application Priority Data

Oct. 31, 1997 (JP) .................................................... 9-300250

(51) Int. Cl.$^7$ ......................... H01L 29/76; H01L 29/788; H01L 29/94; H01L 31/113; H01L 31/119

(52) U.S. Cl. ........................... 257/314; 257/315; 257/316; 257/392

(58) Field of Search ..................................... 257/316, 314, 257/315, 392, 393; 438/372; 418/33.2

(56) References Cited

U.S. PATENT DOCUMENTS

| 5,095,344 | 3/1992 | Harari . |
| 5,374,840 | * 12/1994 | Arai ...................................... 257/372 |
| 5,451,269 | * 9/1995 | Koyama ............................... 418/33.2 |
| 5,514,889 | * 5/1996 | Cho et al. ............................ 257/316 |
| 5,691,547 | * 11/1997 | Manning et al. .................... 257/314 |

FOREIGN PATENT DOCUMENTS

| 2-50476 | 2/1990 | (JP) . |
| 3-246967 | 11/1991 | (JP) . |

OTHER PUBLICATIONS

R. Shirota et al., "A 2.3μm2 Memory Cell Structure for 16Mb Nand Eeproms", IEEE, IEDM, 1990, pp. 90–103–90–106.

L.C. Parillo et al., "Twin–Tub CMOS —A Technology for VLSI Circuits", IEEE,IEDM, 1980, pp. 752–755.

* cited by examiner

*Primary Examiner*—Eddie C. Lee
*Assistant Examiner*—Jesse A. Fenty
(74) *Attorney, Agent, or Firm*—Sughrue, Mion, Zinn, Macpeak & Seas, PLLC

(57) ABSTRACT

In a semiconductor device having a high voltage transistor, a first well region of the high voltage transistor is formed in a semiconductor substrate as a channel region. The first well region has a first conductive type. Second well regions of the high voltage transistor are formed in the semiconductor substrate as a source region and a drain region to sandwich the first well region. The second well region has a second conductive type. A surface of the first region and surfaces of the second well regions have a flat plane.

12 Claims, 4 Drawing Sheets

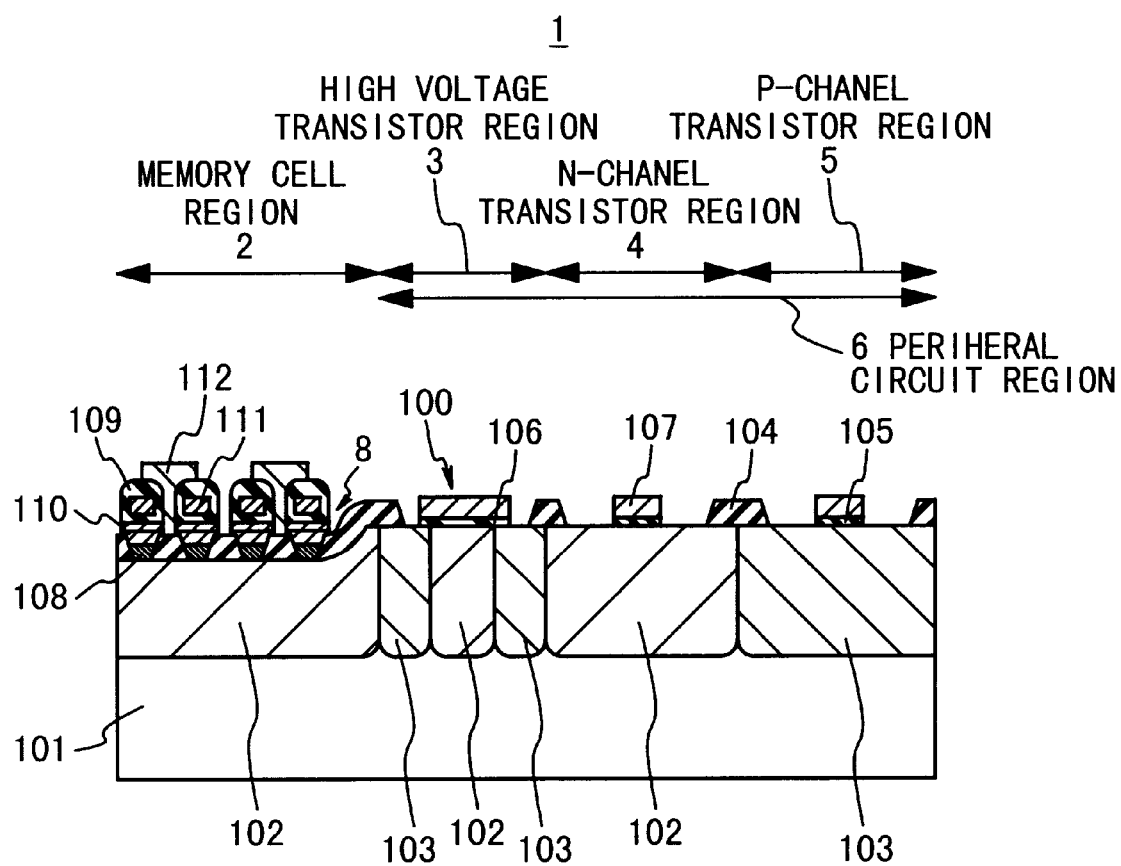

SEMICONDUCTOR DEVICE WITH NO STEP BETWEEN WELL REGIONS

BACKGROUND OF THE INVENTION

1. Field of the Invention

The present invention relates to a semiconductor device, and more particularly to the structure of a non-volatile semiconductor memory device and a method of manufacturing the same.

2. Description of the Related Art

As to a conventional semiconductor memory device, various structures and manufacturing methods are proposed. Especially, as to a non-volatile semiconductor memory device as one of the conventional semiconductor memory devices, various techniques are proposed for problems such as the increase of operation speed and the realization of large capacity.

As an example of the proposals, in the flash memory with an erase gate described in U.S. Pat. No. 5,095,344, the high voltage of 20 V is used in case of an erasing operation. Also, it is reported in "A 2.3 $\mu m^2$ MEMORY CELL STRUCTURE FOR 16 Mb NAND EEPROMs" by R. SHIROTA et al. (IEEE, IEDM 1990) that the high voltage of 18 V in case of a writing operation and of 20 V in case of an erasing operation is used in the NAND type flash memory device. In this way, it is known as general knowledge in the flash memory art that the high voltage of about 20 V is used in the writing and rewriting operations for the high speed operation.

However, when the high voltage of about 20 V is used in the flash memory chip, it is necessary to provide the circuit for selectively applying the high voltage to memory cells of a memory circuit section. For this reason, the transistors which are used to drive and control such a memory circuit section are required to have the voltage endurance higher than the applied voltage.

It has been proposed to use a transistor which has the voltage endurance equal to or higher than 20 V. In this proposal, the source and drain diffusion layers are deeply formed such that the junction voltage endurance can be set to be equal to or higher than 20 V.

Such a well region forming method is proposed in "TWIN-TUB CMOS A TECHNOLOGY FOR VLSI CIRCUITS" by L. C. Parrillo et al. (IEEE, IEDM in 1980). In this method, a double well region structure and a threefold well region structure of P-type wells and N-type wells are formed. As shown in FIG. 1, when an N-type well region 303 and a P-type well region 302 are continuously formed on a substrate 301, a step 304 is always formed between the different well regions 302 and 303.

Also, as shown in FIG. 2, there is a case that a transistor is formed using a semiconductor substrate 401 having well regions such that a P-type well region 402 is used for a channel region, N-type well regions 403 and 404 are used for source and drain regions. A gate electrode 406 is arranged on the P-type well region 402 through an insulating film 405. In this case, as shown in FIG. 2, steps 407 are formed between the source region and the channel region and between the drain region and the channel region. When a wiring layer is formed for the transistor in this state, projection portions are formed in the wiring layer due to the steps 407. For this reason, there is a problem that electric field centers on the projection portions such that the wiring layer is broken or damaged. As a result, the reliability of the wiring layer is decreased. Also, when a high voltage transistor using well regions as the source and drain regions is formed in a flash memory device which has a large step between a memory cell region and a peripheral circuit region, the difference between the memory cell region and the peripheral circuit region becomes further larger due to the step.

As described above, in the conventional memory device, there is the problem that the steps are generated in the channel region so that the reliability of the high voltage transistor is decreased, when the well regions are used for the source and drain regions in the high voltage transistor. This is because the electric field centers on the steps so that the gate insulating film of the high voltage transistor is degraded.

Also, there is another problem that the difference between the memory cell region having a high substrate surface and the peripheral circuit region having a low substrate surface is increased. This is because the fine pattern forming process becomes difficult in the subsequent process because of the increased difference.

Further, there is still another problem that when the peripheral circuit region is formed apart from the memory cell region, another process of forming an insulating film and removing the insulating film is necessary, if a conventional impurity diffusion process is used in the manufacturing method.

In additional, an addition process for forming a reference mark is necessary so that the number of process steps is increased. As a result, the producibility decreases.

SUMMARY OF THE INVENTION

The present invention is accomplished in view of the above problems. Therefore, an object of the present invention is to provide a semiconductor device including a high voltage transistor and a method of manufacturing the same.

Another object of the present invention is to provide a semiconductor device including a non-volatile semiconductor memory device in which high integration is possible with high reliability, and a method of manufacturing the same.

In order to achieve an aspect of the present invention, a semiconductor device having a high voltage transistor, includes a first well region of the high voltage transistor formed in a semiconductor substrate as a channel region and having a first conductive type. Second well regions of the high voltage transistor are formed in the semiconductor substrate as a source region and a drain region to sandwich the first well region and have a second conductive type. A surface of the first region and surfaces of the second well regions have a flat plane.

The semiconductor device may further include a first transistor operating in a higher voltage than a second transistor and formed on the semiconductor substrate, in addition to the high voltage transistor. In this case, the first transistor may be formed on the semiconductor substrate to have, as a channel region, a third well region of the first conductive type.

Also, the semiconductor device may comprise a memory section including the first transistor and a peripheral section including the high voltage transistor. In this case, the semiconductor device is a non-volatile semiconductor memory device.

In order to achieve another aspect of the present invention, a semiconductor memory device includes a memory circuit section formed on a semiconductor substrate, and a peripheral circuit section formed on the semiconductor substrate, for driving and controlling the memory circuit section. A surface of a region where the memory circuit section is formed is lower in height than that of a region where the peripheral circuit section is formed.

The surface of the region where the peripheral circuit section is formed is desirably flat.

Also, the memory circuit section may include a plurality of non-volatile semiconductor memory cell transistors.

Further, the peripheral circuit section may include a plurality of high voltage transistors. In this case, each of the plurality of high voltage transistors desirably has as a channel region composed of a first well region of a first conductive type, and as source and drain regions, second well regions of a second conductive type. A well region of the semiconductor substrate where the memory circuit section is formed is of the first conductive type.

In addition, the surface of the region on which the memory circuit is formed may be used as a reference mark.

In order to achieve still another aspect of the present invention, a method of manufacturing a semiconductor device, includes the steps of:

forming a recess region for a memory cell region on a surface of a semiconductor substrate;

performing a first ion implantation of first impurity ions of a first conductive type to the semiconductor substrate to form a well region of the first conductive type;

forming a resist film on the semiconductor substrate;

patterning the resist film;

performing a second ion implantation of second impurity ions of a second conductive type to the semiconductor substrate using the patterned resist film as a mask; and heating the semiconductor substrate such that first well regions of the first conductive type and second well regions of the second conductive type are formed.

Also, the method may further include forming a reference mark in the recess section.

A memory circuit section is formed in the memory cell region and a peripheral circuit section is formed in a region other than the memory cell region. In this case, non-volatile memory cell transistors of the memory circuit section may be formed as the memory circuit section in the memory cell region. Also, high voltage transistors of the peripheral circuit section which drive and control the memory circuit section may be formed in the peripheral circuit section.

The second ion implantation may be performed in such a manner that the second ion implantation in a dose amount of the second impurity ions is more than that of the first impurity ions.

Further, the second ion implantation may be performed plural times while changing acceleration energy.

BRIEF DESCRIPTION OF THE DRAWINGS

FIG. 3 is a cross section view illustrating the structure of a semiconductor memory device according to an embodiment of the present invention.

DESCRIPTION OF THE PREFERRED EMBODIMENTS

Figure 1:
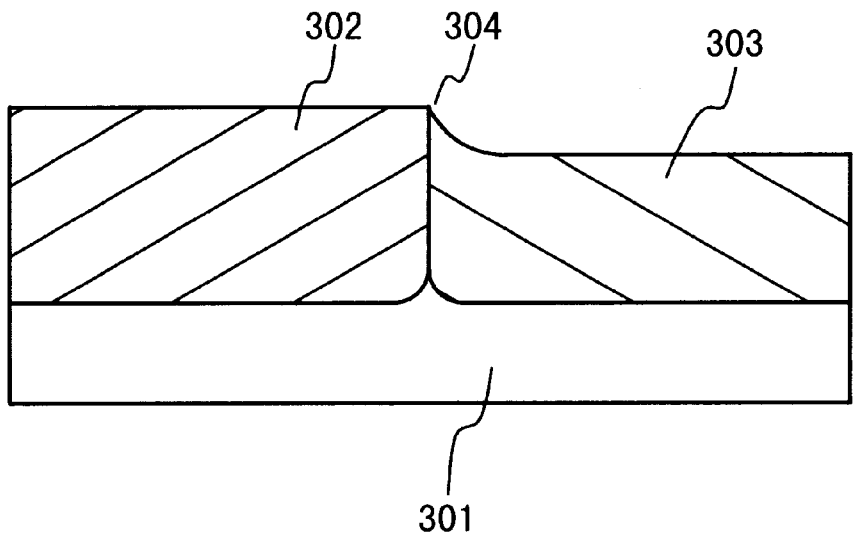
FIG. 1 is a cross sectional view of the well structure of a first conventional example.
Figure 2:
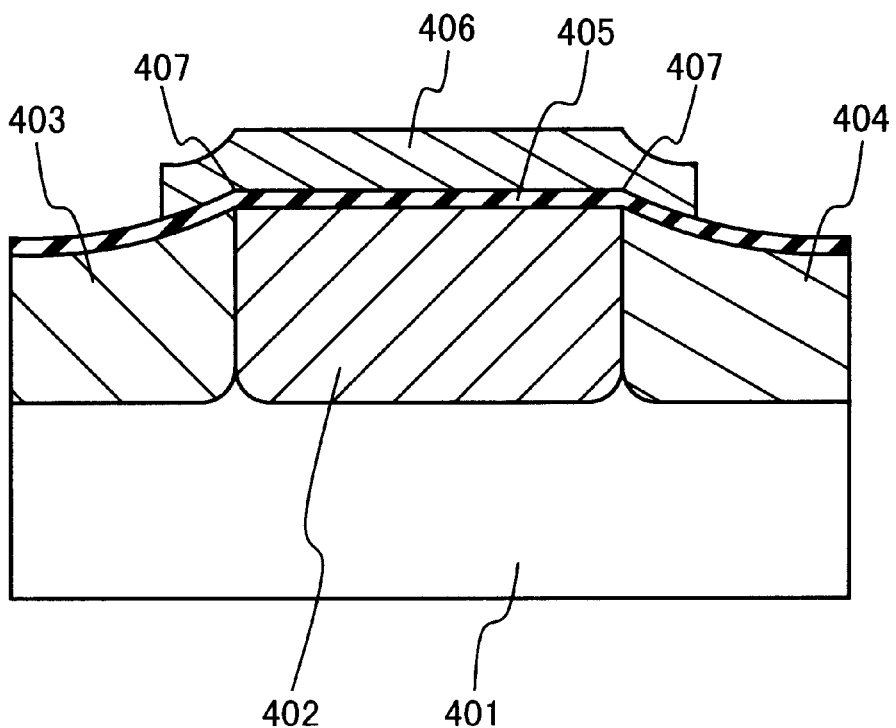
FIG. 2 is a cross sectional view of the well structure of a second conventional example.

The semiconductor device such as a nonvolatile semiconductor memory device of the present invention will be described below with reference to the attached drawings.

The semiconductor memory device of the present invention has a memory cell region and a peripheral circuit region. In the present invention, no step is between a P-type well region and an N-type well region in a high voltage transistor of the non-volatile semiconductor memory device. More specifically, no step is between the P-type well and the N-type well in the high voltage transistor of the peripheral circuit region of the non-volatile semiconductor memory device. Also, the memory cell region is formed such that the difference in height between the memory cell region and the peripheral circuit region is suppressed.

In addition, the semiconductor substrate surface of the memory cell region is formed lower than the semiconductor substrate surface of the peripheral circuit region. Also, a first positioning reference mark for the photolithography is formed lower than the semiconductor substrate surface of the peripheral circuit region. Thus, P-type impurity ions are implanted to form P-type well regions in the semiconductor substrate surface. Patterning is performed for the N-type well regions by a photolithography method using the first positioning reference mark, and N-type impurity ions more than the P-type impurity ions are ion-implanted to form the N-type well regions. In other words, in the present invention, the first positioning reference mark for the photolithography is already formed in the case to form well regions.

The semiconductor device according to an embodiment of the present invention will be described below in detail with reference to the attached drawings. FIG. 3 is a cross sectional view illustrating the structure of the semiconductor memory device according to the embodiment of the present invention.

Referring to FIG. 3, the semiconductor memory device is composed of the memory cell region 2 and the peripheral circuit region 6. In the peripheral circuit region 6 of the semiconductor memory device, one of the first conductive type well regions 102 is formed in a semiconductor substrate 101 as the channel region of a high voltage transistor 100. Also, two of the second conductive type well regions 103 are used as the source and drain regions of the high voltage transistor 100. In addition, the main surface of the first conductive type well regions 102 and the main surface of the second conductive type well regions 103 are formed to have the identical flat plane to each other in the high voltage transistor 100.

The memory cell region 2 is formed to have a lower surface than that of the peripheral circuit region 6. The memory cell transistors 109, 110, 111 and 112 typically have heights higher than that of the high voltage transistor 100, an N-channel transistor 4 or a P-channel transistor 5 in the peripheral circuit region. As a result, because the top of the memory cell transistor is positioned lower, the difference in top height between the memory cell transistor and the transistor in the peripheral circuit region 6 can be made small.

Next, the method of manufacturing the semiconductor memory device according to the embodiment of the present invention will be described below with reference to FIGS. 4A to 4F.

Figure 4A:
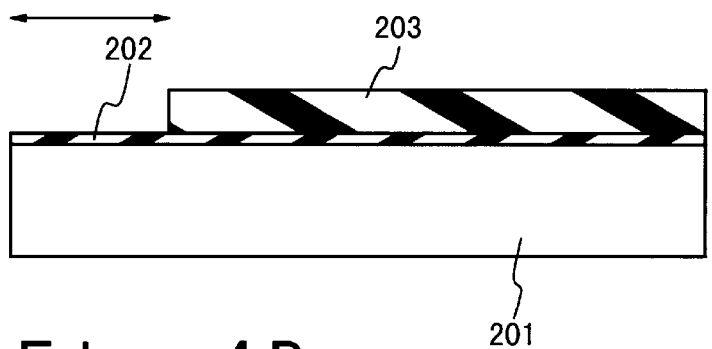
FIGS. 4A to 4F are cross sectional views illustrating the manufacturing process the semiconductor memory device according to the embodiment of the present invention.

First, as shown in FIG. 4A, an oxide film 202 is formed on a P-type silicon substrate 201 by a heat oxidation method to have the film thickness of 40 nm. Then, a nitride film 203 is deposited on the oxide film 202 by a CVD method to have the film thickness of 150 nm. Only a portion of the nitride film corresponding to the memory cell region 2 is removed by a photolithography method and an anisotropic dry etching.

Figure 4B:
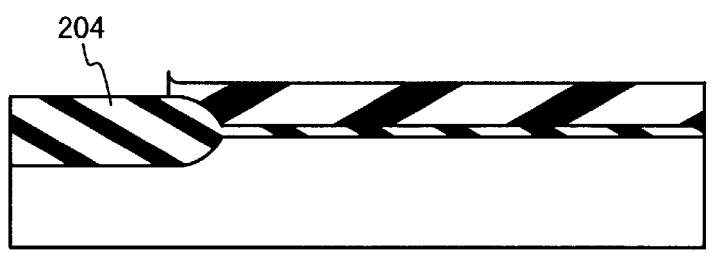

Next, as shown in FIG. 4B, the silicon substrate surface is oxidized by the heat oxidation method. At this time, because the nitride film 203 functions as an oxidation-resistant mask, only the memory cell region is selectivity oxidized such that an oxide film (LOCOS film) 204 is formed. In this case, a reference mark is also oxidized at the same time, so that the reference mark is formed for positioning in the photolithography method of the following process.

The reference mark is formed in the region other than the memory cell region and the peripheral circuit region, usually on a scribe line. By oxidizing the reference mark, a step is formed on the silicon substrate in the same manner as the memory cell region. Thus, it is possible to be used as the reference mark. Therefore, the film thickness of the oxide film of the reference mark is controlled such that a step can be formed to allow the mark to be detected in the photolithography execution time. Also, this step is useful for the relaxation of the step between the memory cell region in a high level and the peripheral circuit region in a low level.

Figure 4C:
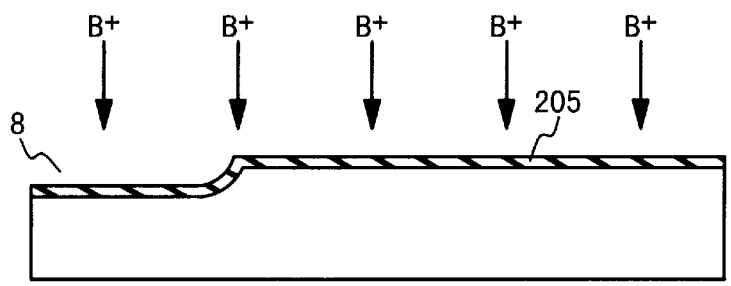

In other words, in the present invention, the LOCOS oxide film is formed in the memory cell region 2. Then, the LOCOS oxide film is removed in the subsequent process, as shown in FIG. 4C, such that a necessary concave recess section 8 is formed. The concave recess section 8 is used for the reference level of the reference mark. In this embodiment, the film thickness of the LOCOS oxide film 204 is 600 nm.

Next, the nitride film 203, the oxide film 202 and the oxide film 204 are removed by an etching method. Then, an oxide film 205 is formed by the heat oxidation method to have the film thickness of 40 nm. Subsequently, ion implantation of P-type impurity ions such as boron ions are performed such that a P-type well region is formed in the whole surface of the silicon substrate 201. At this time, the ion implantation may be performed once or plural times while an acceleration energy and a dose amount are changed so that the well region is suitable for the characteristics of the memory cells and peripheral circuit transistors. In this embodiment, the ion implantation is performed once with the acceleration energy of 50 KeV and the dose amount of $3 \times 10^{12}$ cm$^{-2}$.

Figure 4D:
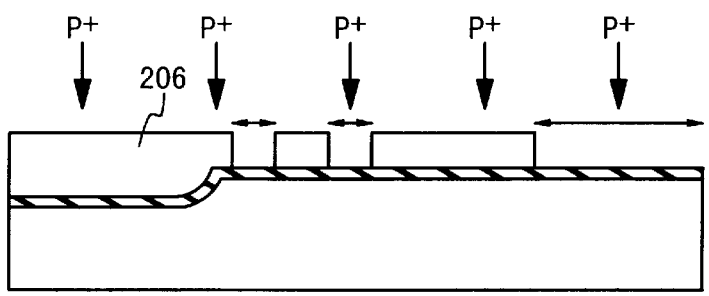

Next, as shown in FIG. 4D, a photoresist layer 206 is formed and then patterned by a photolithography method to form opening portions for N-type well regions. Then, ion implantation of N-type impurity ions such as phosphorus ions is performed to form the N-type well regions, using the patterned photoresist layer 206 as a mask. At this time, the ion implantation may be performed once or plural times while an acceleration energy and a dose amount are changed so that the N-type well regions are suitable for the characteristics of the peripheral circuit transistors.

Also, because the boron ions for the P-type well region are already implanted into the silicon substrate surface, the dose amount of phosphorus ions needs to be more than that of boron ions to form the N-type well regions. Specifically, in this embodiment, the ion implantation is performed once with the acceleration energy of 100 KeV and the dose amount of $9 \times 10^{12}$ cm$^{-2}$.

Figure 4E:
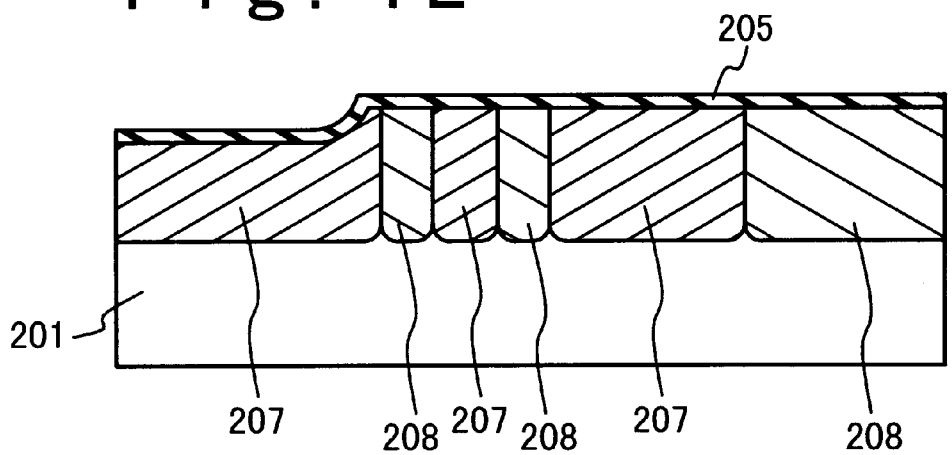

Next, as shown in FIG. 4E, the thermal diffusion method at high temperature such as the temperature of 1200° C. is performed in a nitrogen ambient such that the N-type impurity ions and the P-type impurity ions are deeply diffused. As a result, P-type well regions 207 and N-type well regions 208 are formed. Therefore, no step exists between the P-type well region 207 and the N-type well region 208 in the peripheral circuit region 6. At this time, when the ion implantation is performed plural times using a high energy ion implantation, the thermal diffusion method is not performed at the high temperature such that the impurity ions are not diffused deeply. However, instead, a heat treatment is performed at a relatively low temperature such that the impurity ions can be activated.

Figure 4F:
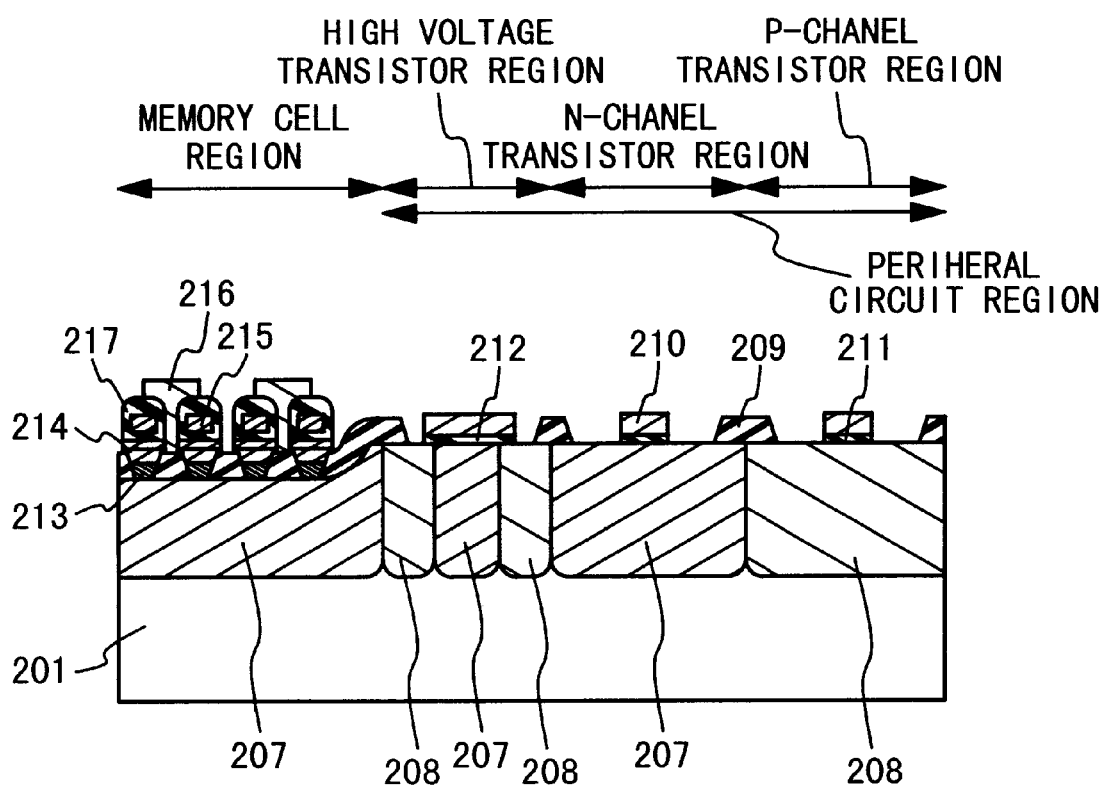

After that, as shown in FIG. 4F, the transistors such as an N-channel transistor 211, a P-channel transistor 210, and a high voltage transistor 212 are formed in the peripheral circuit region 6. Also, memory cell transistors 214, 215, 216 and 217 are formed in the memory cell region 2.

That is, in the present invention, the first reference mark is formed before the well regions are formed. The reference mark is used as a reference positioning point in the photolithography process. Also, in the present invention, the semiconductor substrate surface of the memory cell region is made lower than that of the peripheral circuit region to form a concave recess section. The reference mark is formed in on the concave recess section.

As described above, one feature of the semiconductor device according to the embodiment of the present invention is in that no step is between the main surface of the first conductive type well region 102 and the main surfaces of the second conductive type well regions 103. Thus, in the case that a gate electrode is arranged over the P-type and N-type well regions, the gate electrode can be arranged comparatively low.

As a result, because the bending portion of a wiring layer formed above the gate electrode becomes small, so that there is no possibility that the wiring layer is broken and the circuit reliability is improved.

Also, because the height of the high voltage transistor can be set low, it is advantageous in the high integration of the transistors.

In order to form the high voltage transistor 100 according to the embodiment of the present invention, the first conductive type impurity ions such as boron ions which are P-type impurity ions are previously ion-implanted in the surface of the substrate 101 to form the first conductive type well region 102. Then, the main surface of the substrate 101 is coated by a photoresist layer and opening portions are formed in predetermined regions using the lithography method. Subsequently, the second conductive type impurities such as phosphorus (P) ions or arsenic (As) ions which are N-type impurity ions are ion-implanted to form the second conductive type well regions 103. The first conductive type well region 102 is used as the channel region, and the second conductive type well regions 103 are used as the source and drain regions.

In the present invention, when the source and drain regions should be formed, only the ion implantation technique is used. Therefore, as described above, the well regions can be formed such that the main surface of first conductive type well region 102 and the main surface of second conductive type well regions 103 have the identical flat plane to each other.

Also, in the method of manufacturing the transistor according to the embodiment of the present invention, the boundary portion between the first conductive type well region 102 and the second conductive type well region 103 can be formed to have a steep angle, i.e., a perpendicular angle to the main surface of the substrate 101. Therefore, the size of the transistor can be reduced, so that it becomes possible to accomplish the high integration of the transistors.

Also, the high voltage transistor 100 according to the embodiment of the present invention is desirable to be formed on the substrate on which other semiconductor devices which operate in the high voltage are formed. In other words, as shown in FIG. 3, the high voltage transistor 100 according to the embodiment of the present invention is desirably formed on the semiconductor substrate 101 on which the well region 102 is formed where the memory cell region is provided.

More specifically, the memory cell transistors 109, 110, 111 and 112 are desirably formed in the first conductive type well region 102 which is formed at the same time as the first conductive type well region 102 which is used as the channel region of the high voltage transistor 100. Also, the memory cell transistors 109, 110, 111, 112 according to the embodiment of the present invention are formed in the memory circuit section of the memory cell region. For example, the memory circuit section is desirably a non-volatile semiconductor memory circuit section which is composed of non-volatile transistors.

Moreover, in the semiconductor device using the high voltage transistor 100 according to the embodiment of the present invention, the semiconductor device is formed such that the substrate surface where the memory circuit section is arranged to be composed of the memory cell transistors 109, 110, 111, 112 in the memory cell region 2 which is provided on the substrate 101. The memory cell region 2 is lower in semiconductor surface than the peripheral circuit region 6 on which the transistors are arranged to drive and control the memory cell transistors which are provided on the same substrate 101.

In addition, as described above, it is desirable that the plane where the transistors of the peripheral circuit region 6 are arranged is flat. Also, as described above, it is desirable that the memory circuit section composed of the memory cell transistors 109, 110, 111 and 112 in the memory cell region 2 is the memory circuit section composed of non-volatile semiconductor devices.

Therefore, as most desirable embodiment of the present invention, for example, the high voltage transistor 100 is arranged in the region adjacent to the memory cell region 2 to drive and control the non-volatile semiconductor memory circuit section. In other words, it is desirable that the first conductive type well region 102 where the channel section of the high voltage transistor 100 is formed has the same conductive type as that of the memory cell region 2 where the memory circuit section 7 composed of non-volatile memory cell transistors in the same substrate 101.

Moreover, as another feature of the semiconductor device according to the embodiment of the present invention, a concave recess section 8 is formed by a suitable method such that the surface plane of the memory cell region 2 is lower than the surface plane of the peripheral transistor region 6. The concave recess section 8 is used for the reference mark when the peripheral circuit section is formed.

As described above, according to the semiconductor device of the present invention, the reliability of the high voltage transistor can be improved. This is because there is not a step between the P-type well region for the channel region and the N-type well region for the source or drain region in the high voltage transistor.

Also, the fine pattern formation and reduction of the number of processes can be accomplished at the same time. This is because the difference in top position between the memory cell region and the peripheral circuit region can be reduced, so that the fine pattern formation is made possible. Also, at the same time, the reference mark for alignment is formed. Therefore, the number of processes can be reduced, compared with the case where the memory circuit section and the peripheral circuit section are not formed at the same time.

Further, when high energy ion implantation is performed for the well region formation, the thermal diffusion process can be omitted.

What is claimed is:

1. A semiconductor device having a high voltage transistor, comprising:

a first well region of said high voltage transistor formed in a semiconductor substrate as a channel region and having a first conductive type; and second well regions of said high voltage transistor formed in said semiconductor substrate as a source region and a drain region to sandwich said first well region and having a second conductive type, wherein a surface of said first well region and surfaces of said second well regions have a flat plane.

2. A semiconductor device according to claim 1, further including a first transistor operating in a higher voltage than a second transistor and formed on said semiconductor substrate, in addition to said thigh voltage transistor.

3. A semiconductor device according to claim 2, wherein said first transistor is formed on said semiconductor substrate to have, as a channel region, a third well region of said first conductive type.

4. A semiconductor device according to claim 2, wherein said semiconductor device comprises a memory section including said first transistor and a peripheral section including said high voltage transistor.

5. A semiconductor device according to claim 4, wherein said semiconductor device is a non-volatile semiconductor memory device.

6. A semiconductor memory device comprising:

a memory circuit section formed on a semiconductor substrate; and a peripheral circuit section formed on said semiconductor substrate, having at least one high voltage transistor having a channel well region sandwiched between a source well region and a drain well region and said at least one high voltage transistor having a flat surface, for driving and controlling said memory circuit section, wherein a surface of a region where said memory circuit section is formed is lower in height than that of a region where said peripheral circuit section is formed.

7. A semiconductor memory device according to claim 6, wherein said surface of said region where said peripheral circuit section is formed is flat.

8. A semiconductor memory device according to claim 6, wherein said memory circuit section includes a plurality of non-volatile semiconductor memory cell transistors.

9. A semiconductor memory device according to claim 6, wherein said at least one high voltage transistor of said peripheral circuit section includes a plurality of high voltage transistors.

10. A semiconductor memory device according to claim 9, wherein each of said plurality of high voltage transistors has as a channel composed of a first well region of a first conductive type, and as source and drain regions second well regions of a second conductive type.

11. A semiconductor memory device according to claim 10, wherein a well region of said semiconductor substrate where said memory circuit section is formed is of said first conductive type.

12. A semiconductor memory device according to claim 6, wherein said surface of said region on which said memory circuit is formed is used as a reference mark.

* * * * *